United States Patent
Nakamura et al.

(10) Patent No.: US 9,595,633 B2
(45) Date of Patent: Mar. 14, 2017

(54) METHOD FOR PRODUCING LIGHT-EMITTING DEVICE AND METHOD FOR PRODUCING GROUP III NITRIDE SEMICONDUCTOR

(71) Applicant: TOYODA GOSEI CO., LTD., Kiyosu-shi (JP)

(72) Inventors: Ryo Nakamura, Kiyosu (JP); Misato Boyama, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/928,904

(22) Filed: Oct. 30, 2015

(65) Prior Publication Data

US 2016/0126415 A1 May 5, 2016

(30) Foreign Application Priority Data

Nov. 3, 2014 (JP) ................................ 2014-223861

(51) Int. Cl.
*H01L 33/12* (2010.01)
*H01L 33/00* (2010.01)
*H01L 33/06* (2010.01)

(52) U.S. Cl.
CPC ............ *H01L 33/007* (2013.01); *H01L 33/06* (2013.01)

(58) Field of Classification Search
CPC ........ H01L 33/12; H01L 33/007; H01L 33/06; H01L 33/32
USPC .......................................................... 438/47
See application file for complete search history.

(56) References Cited

U.S. PATENT DOCUMENTS

2015/0287810 A1* 10/2015 Kerber ............. H01L 29/66795
257/192

FOREIGN PATENT DOCUMENTS

| JP | 2001-332763 A | 11/2001 |
| JP | 2010-080619 A | 4/2010 |
| JP | 2012-216751 A | 11/2012 |

* cited by examiner

*Primary Examiner* — Peter Bradford
(74) *Attorney, Agent, or Firm* — McGinn IP Law Group, PLLC

(57) ABSTRACT

On the well layer, a first InGaN protective layer is formed at the same temperature employed for the well layer through MOCVD. TMI is pulse supplied. A TMI supply amount is kept constant at a predetermined value of more than 0 μmol/min and not more than 2 μmol/min. Moreover, a duty ratio is kept constant at a predetermined value of more than 0 and not more than 0.95. The In composition ratio of the first protective layer is almost directly proportional to the duty ratio. The In composition ratio of the first protective layer can be easily and accurately controlled by controlling the duty ratio so as to have an In composition ratio within a range of more than 0 at % and not more than 3 at %.

13 Claims, 4 Drawing Sheets

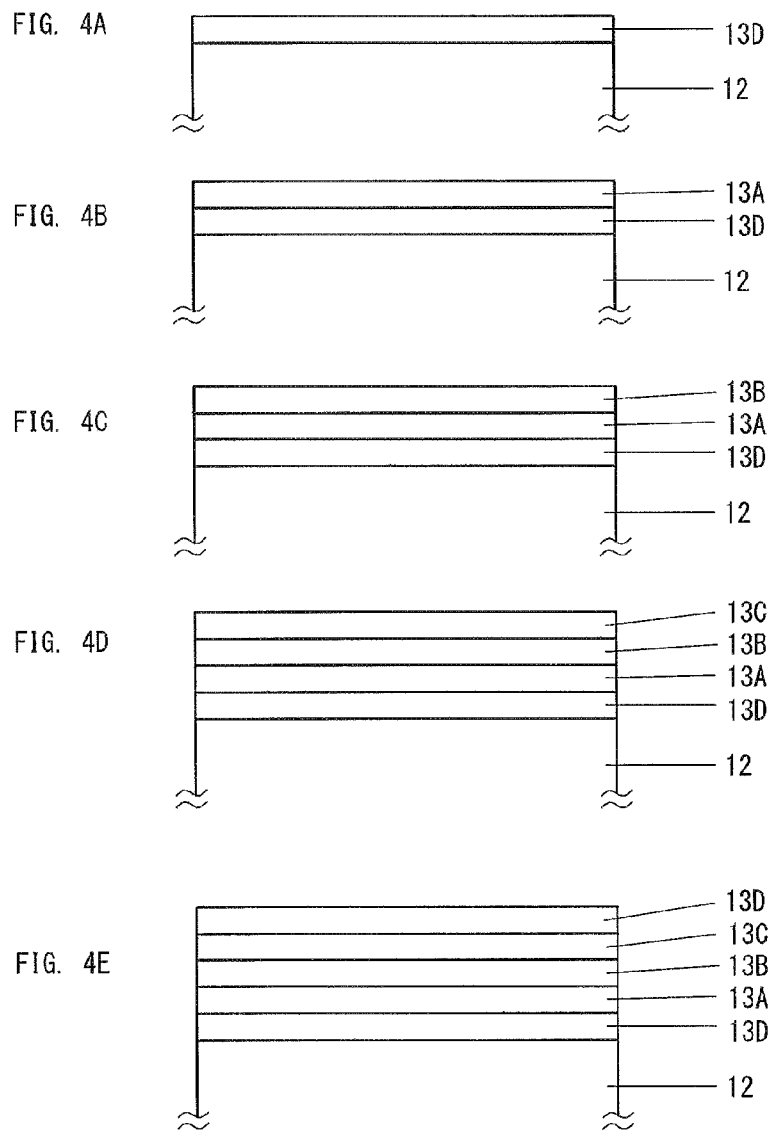
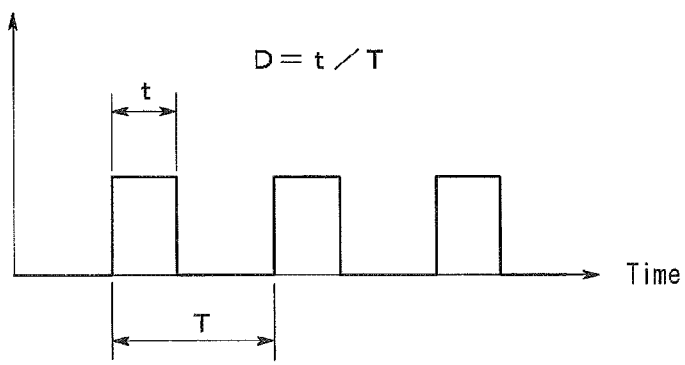

METHOD FOR PRODUCING LIGHT-EMITTING DEVICE AND METHOD FOR PRODUCING GROUP III NITRIDE SEMICONDUCTOR

BACKGROUND OF THE INVENTION

Field of the Invention

The present invention relates to a method for producing a Group III nitride semiconductor light-emitting device and a method for producing a Group III nitride semiconductor, more specifically a method for forming a Group III nitride semiconductor containing In.

Background Art

A MQW structure in which an InGaN well layer and an AlGaN barrier layer are sequentially and repeatedly deposited, is widely used as a light-emitting layer of Group III nitride semiconductor light-emitting device. Since the barrier layer is formed of AlGaN, the growth temperature thereof must be higher than that of the well layer so as to obtain good crystallinity. Therefore, it is necessary to increase the temperature after the formation of the well layer, and then to grow the barrier layer. However, In is evaporated from the well layer due to heating, thereby resulting in reduction of emission efficiency or variation of emission wavelength. Therefore, a protective layer being grown at the same temperature as the growth temperature of the well layer is provided between the well layer and the barrier layer to prevent In evaporation.

Japanese Patent Application Laid-Open (kokai) No. 2010-80619 describes that a protective layer has a single layer structure of AlGaN or a layered structure of GaN and AlGaN. Moreover, Japanese Patent Application Laid-Open (kokai) No. 2012-216751 describes that a protective layer is formed of GaN having a thickness of 6 Å (0.6 nm). Further, Japanese Patent Application Laid-Open (kokai) No. 2001-332763 describes that a protective layer is formed of InGaN having an In composition ratio of 7 at % to 60 at %.

Since the protective layer is grown at the same temperature as employed for the well layer, the crystallinity thereof is low, resulting in reduction of emission efficiency. Therefore, the present inventors have studied to improve the crystal quality by incorporating a small amount of In as a surfactant (impurity to flatten the surface) in the protective layer. The amount of In is small because the incorporation of an excessive amount of In has the opposite effect, resulting in deterioration of crystal quality.

However, the protective layer is grown at a low temperature because it is grown at the same temperature as employed for the well layer. In is easily incorporated in the crystal at a low temperature, and a certain amount of In is included in the crystal even if the minimum amount of raw material gas as In source is supplied. Thus, a protective layer could not be formed of Group III nitride semiconductor having a low In composition ratio.

SUMMARY OF THE INVENTION

In view of the foregoing, an object of the present invention is to form a protective layer made of Group III nitride semiconductor having a low In composition ratio even at a low growth temperature.

In one aspect of the present invention, there is provided a method for producing a Group III nitride semiconductor light-emitting device having a light-emitting layer with a MQW structure, the method comprising:

forming the light-emitting layer through MOCVD by sequentially and repeatedly depositing a well layer made of Group III nitride semiconductor containing In, a first protective layer made of Group III nitride semiconductor containing In having a band gap equal to or larger than a band gap of the well layer, and a barrier layer made of Group III nitride semiconductor having a band gap larger than a band gap of the well layer; wherein the first protective layer is formed at the same temperature as employed for the well layer by pulse supplying a raw material gas as an In source so as to achieve an In composition ratio of more than 0 at % and not more than 3 at %. The composition ratio at % means atomic percent of a semiconductor crystal.

Pulse supplying the raw material gas as an In source is to repeat supply of gas and non-supply of gas.

In pulse supplying the raw material gas as an In source, the pulse width, pulse cycle period, pulse height (supply amount of raw material gas as an In source) may be controlled to any value as long as the number of pulses is not less than two per a first protective layer. The In composition ratio can be easily and accurately controlled by controlling particularly the duty ratio (ratio of pulse width to pulse cycle period). It is because the In composition ratio is almost directly proportional to the duty ratio. The duty ratio may be more than 0 and not more than 0.95. For easier control, the duty ratio is controlled preferably within a range of 0.35 to 0.95, and more preferably within a range of 0.35 to 0.75.

The In composition ratio of the first protective layer is preferably 1 at % to 3 at %, and more preferably 1 at % to 2.5 at % in order to improve the crystal quality of the first protective layer and the emission efficiency.

The supply amount of the raw material gas as an In source is preferably more than 0 μmol/min and not more than 2 μmol/min. Thereby, the first protective layer has an In composition ratio of more than 0 at % and not more than 3 at %.

The growth temperatures of the well layer and the first protective layer are preferably 700° C. to 850° C. Thereby, the well layer has a higher In composition ratio, and the emission wavelength is easily and accurately controlled. The growth temperatures of the well layer and the first protective layer are not necessarily exactly the same, and a tolerance of approximately ±10° C. is allowable.

A second protective layer made of Group III nitride semiconductor containing Al may be formed between the first protective layer and the barrier layer, and the second protective layer may have an Al composition ratio so as to have a band gap larger than that of the first protective layer. Thereby, lattice matching between the first protective layer and the barrier layer can be improved, leading to improvement of the emission efficiency.

The first protective layer may be formed of InGaN or AlGaInN. Moreover, the second protective layer may be formed of AlGaN or AlGaInN.

The raw material gas as an In source may be an organic metal gas containing In such as trimethylindium (TMI;In(CH$_3$)$_3$) or triethylindium (TEI;In(C$_2$H$_5$)$_3$).

In the other aspect of the present invention, there is provided a method for producing a Group III nitride semiconductor, wherein the In composition ratio of more than 0 at % and not more than 3 at % is achieved by pulse supplying the raw material gas as an In source when forming a Group III nitride semiconductor containing In at a temperature of 700° C. to 850° C. through MOCVD.

According to the method for producing a Group III nitride semiconductor of the present invention, the In composition ratio can be reduced by pulse supplying the raw material gas as an In source even when a protective layer made of Group III nitride semiconductor containing In is formed at the same temperature as employed for the well layer, that is, when a Group III nitride semiconductor containing In is formed at a low temperature. More specifically, the In composition ratio can be reduced to more than 0 at % and not more than 3 at %.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIGS. 4A to 4E are sketches showing processes for forming the light-emitting layer 13;

FIG. 5 is a graph showing the relationship between TMI supply amount and time;

DETAILED DESCRIPTION OF PREFERRED EMBODIMENTS

A specific embodiment of the present invention will next be described with reference to the drawings. However, the present invention is not limited to the embodiment.

Embodiment 1

Figure 1:
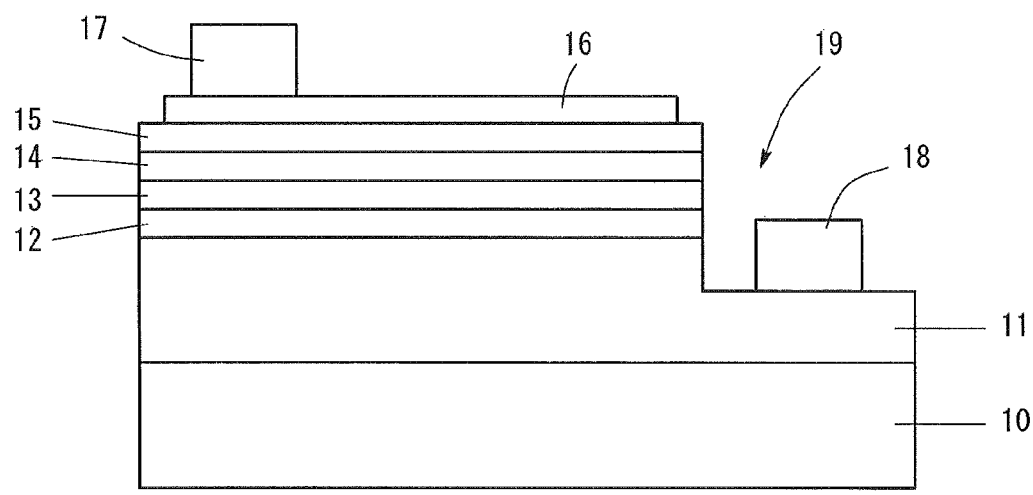
FIG. 1 shows a structure of a light-emitting device according to Embodiment 1.

FIG. 1 shows a structure of a Group III nitride semiconductor according to Embodiment 1. As shown in FIG. 1, the light-emitting device according to Embodiment 1 includes a sapphire substrate 10, an n-type contact layer 11 disposed on the sapphire substrate 10, an n-type cladding layer 12 disposed on the n-type contact layer 11, a light-emitting layer 13 disposed on the n-type cladding layer 12, a p-type cladding layer 14 disposed on the light-emitting layer 13, and a p-type contact layer 15 disposed on the p-type cladding layer 14. Moreover, the light-emitting device according to Embodiment 1 includes a transparent electrode 16 disposed on a portion of the p-type contact layer 15, a p-electrode 17 disposed on the transparent electrode 16, and an n-electrode 18 disposed on a portion of the n-type contact layer 11 which is exposed by a trench 19. The light-emitting device according to Embodiment 1 is of a face-up type having the above structure.

The sapphire substrate 10 is a growth substrate for growing a Group III nitride semiconductor crystal on the main surface thereof. The main surface is, for example, a-plane or c-plane. The surface of the sapphire substrate 10 may be roughened in a dot or stripe pattern to improve light extraction efficiency. Other than the sapphire substrate, substrates made of materials such as GaN, SiC, ZnO, and Si may be employed.

The n-type contact layer 11 is disposed via an AlN buffer layer (not illustrated) on the uneven surface of the sapphire substrate 10. The buffer layer may be formed of GaN or AlGaN other than AlN. On the n-type contact layer 11, the n-type cladding layer 12 is disposed. The n-type contact layer 11 is formed of n-GaN having a Si concentration of, for example, $1 \times 10^{18}/cm^3$ or more. The n-type contact layer 11 may comprise a plurality of layers having different Si concentrations. The n-type cladding layer 12 has a superlattice structure in which, for example, InGaN and n-GaN are alternately and repeatedly deposited. An ESD layer for improving electrostatic breakdown voltage may be formed between the n-type contact layer 11 and the n-type cladding layer 12. The ESD layer is a layer in which, for example, non-doped GaN and n-GaN are deposited.

Figure 2:
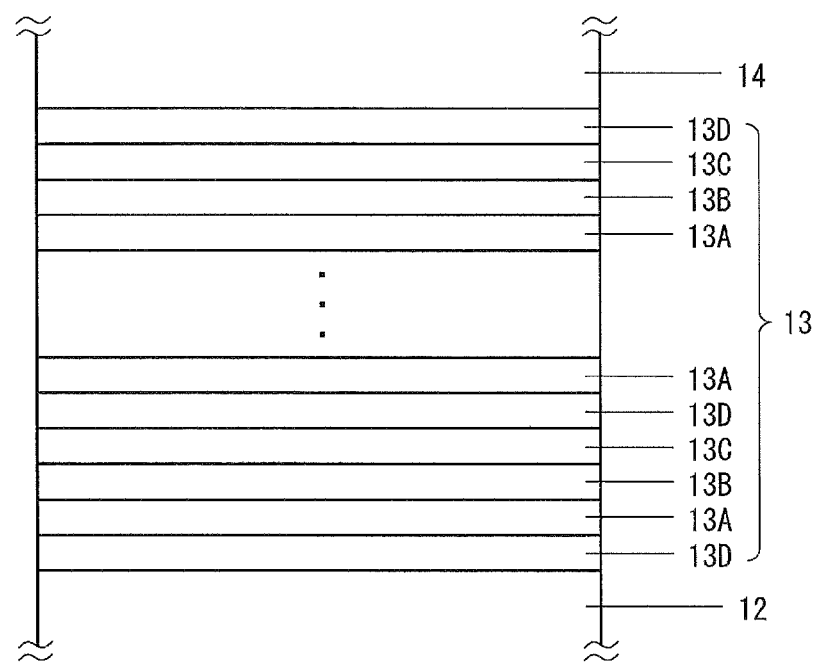
FIG. 2 shows a structure of a light-emitting layer 13.

As shown in FIG. 2, the light-emitting layer 13 has a MQW structure in which a plurality of layer units are repeatedly deposited, each layer unit comprising a well layer 13A, a first protective layer 13B, a second protective layer 13C, and a barrier layer 13D deposited in this order. The number of repetitions is three to ten times. The n-type cladding layer 12 and the p-type cladding layer 14 are both in contact with the barrier layer 13D. The overall thickness of the light-emitting layer 13 is 500 nm to 700 nm. The detailed structure of the light-emitting layer 13 will be described later.

On the light-emitting layer 13, the p-type cladding layer 14 and the p-type contact layer 15 are sequentially deposited. The p-type cladding layer 14 may have a superlattice structure in which p-InGaN and p-AlGaN are alternately and repeatedly deposited. p-InGaN has an In composition ratio of 5 at % to 12 at % and a thickness of 2 nm. Moreover, p-AlGaN has an Al composition ratio of 25 at % to 40 at % and a thickness of 2.5 nm. The p-type contact layer 15 is formed of p-GaN having a Mg concentration of $1 \times 10^{19}/cm^3$ or more and a thickness of 80 nm. The p-type contact layer 15 may comprise a plurality of layers having different Mg concentrations.

The transparent electrode 16 is formed of ITO so as to cover almost the entire surface of the p-type contact layer 15. The transparent electrode 16 may be formed of, for example, IZO (indium zinc oxide) or ICO (indium cerium oxide) other than ITO.

The p-electrode 17 is disposed on the transparent electrode 16. The n-electrode 18 is disposed on the n-type contact layer 11 exposed in the bottom surface of the trench 19. The trench 19 is provided in a part of the semiconductor layer, and has a depth extending from the surface of the p-type contact layer 15 to the n-type contact layer 11. The p-electrode 17 and the n-electrode 18 have a pad portion to which a wire is connected, and a wiring portion continuous with the pad portion, which extends in a linear pattern.

[Detailed Structure of Light-Emitting Layer 13]

The detailed structure of the light-emitting layer 13 will next be described with reference to FIG. 2.

The well layer 13A is formed of InGaN having an In composition ratio within such a range that the emission wavelength is 380 nm to 460 nm. The well layer 13A has a thickness within a range of 1 nm to 5 nm.

The first protective layer 13B is disposed in contact with and on the well layer 13A. The first protective layer 13B is a layer being provided to prevent In evaporation from the well layer 13A during heating up to a temperature for forming the barrier layer 13D after the formation of the well layer 13A.

The first protective layer 13B is formed of InGaN having a band gap smaller than that of the well layer 13A. When the Group III nitride semiconductor is doped with In, In acts as a surfactant to suppress growth in a vertical direction (thickness direction) and to promote growth in a lateral direction (direction parallel to main surface). Therefore, the crystal quality of the first protective layer 13B is improved by incorporating In acting as a surfactant in the first protective layer 13B, thereby improving the emission efficiency. However, when the In composition ratio is more than 3 at %, new crystal defects occur, and the crystal quality is deteriorated, resulting in reduction in device reliability, which is not desirable. Thus, the In composition ratio is more than 0 at % and not more than 3 at %. More preferably, the In composition ratio is 0.5 at % to 3 at %, and further preferably, 1 at % to 2.5 at %. The first protective layer 13B may be formed of Group III nitride semiconductor containing In such as AlGaInN. Moreover, since the In ratio in the crystal of the first protective layer 13B is small, the crystal can be GaN doped with In, not mixed crystal or In compound semiconductor. However, In the present specification, it is written as InGaN, and described as mixed crystal.

Since the first protective layer 13B is grown at the same temperature as employed for the well layer 13A, InGaN cannot be usually formed so as to have an In composition ratio of more than 0 at % and not more than 3 at %. Therefore, InGaN having a low In composition ratio is formed by the forming method described later.

The thickness of the first protective layer 13B is 0.2 nm to 1.8 nm. As used herein, "the thickness of the first protective layer 13B" is not the thickness when the first protective layer 13B was formed, but the thickness of the first protective layer 13B remained without being thermally decomposed even after heating after the formation of the first protective layer 13B. Such a thickness range reduces trapping or recombination of carriers in the first protective layer 13B, thereby improving the emission efficiency. The thickness is more preferably within a range of 0.5 nm to 1.0 nm, and further preferably, within a range of 2 to 3 molecular layers. The thickness of one monolayer corresponds to ½ of the c-axis lattice constant of GaN, and the thickness of two monolayers is 0.5185 nm. The overall crystallinity of the productive layer is improved by providing the second protective layer 13C having a lattice constant close to that of the well layer 13A between the second protective layer 13C and the well layer 13A, thereby improving the emission efficiency.

The first protective layer 13B is not limited to InGaN, but may be Group III nitride semiconductor containing In such as AlGaInN.

The second protective layer 13C is disposed in contact with and on the first protective layer 13B. The second protective layer 13C is provided to reduce differences in lattice constant between the first protective layer 13B and the barrier layer 13D, thereby improving the crystallinity of the barrier layer 13D.

The second protective layer 13C is formed of AlGaN. The second protective layer 13C may have any Al composition ratio as long as the band gap of the second protective layer 13C is larger than that of the first protective layer 13B. However, the difference in band gap of the second protective layer 13C from the barrier layer 13D is preferably smaller. The Al composition ratio is preferably within a range of 1.5 at % to 3.5 at %, and further preferably, within a range of 2 at % to 3 at %. The second protective layer 13C may be Group III nitride semiconductor containing Al such as AlGaInN. In this case, the In composition ratio may be the same as that of the first protective layer 13B, and the crystallinity of the second protective layer 13C is expected to be improved.

The thickness of the second protective layer 13C is 0.2 nm to 1.8 nm. Such a thickness range reduces trapping or recombination of carriers in the second protective layer 13C, thereby improving the emission efficiency. The thickness is more preferably within a range of 0.5 nm to 1.6 nm, and further preferably, within a range of 0.5 nm to 1.1 nm.

The barrier layer 13D is formed of AlGaN. The Al composition ratio is 3 at % to 10 at %, and the thickness is 1 nm to 10 nm. The barrier layer 13D is not limited to a single AlGaN layer but may comprise a plurality of layers, for example, a plurality of layers having different Al composition ratios. As long as the band gap of the barrier layer 13D is larger than that of the well layer 13A, the barrier layer 13D may be Group III nitride semiconductor containing Al such as AlGaInN.

In Embodiment 1, a layered structure of the first protective layer 13B and the second protective layer 13C is provided as a protective layer between the well layer 13A and the barrier layer 13D. However, only the first protective layer 13B may be formed without forming the second protective layer 13C. In this case, the first protective layer 13B is preferably formed of AlGaInN so as to have a larger difference in band gap from the well layer 13A.

[Processes for Producing a Light-Emitting Device]

Next will be described processes for producing the light-emitting device according to Embodiment 1 with reference to FIGS. 3A to 3D and FIGS. 4A to 4E. The Group III nitride semiconductor is crystal grown through normal pressure MOCVD. The raw material gases employed in MOCVD are as follows: ammonia ($NH_3$) as a nitrogen source; trimethylgallium (TMG;$Ga(CH_3)_3$) as a Ga source; trimethylindium (TMI;$In(CH_3)_3$) as an In source; trimethylaluminum (TMA;$Al(CH_3)_3$) as an Al source; silane ($SiH_4$) as an n-type doping gas;

bis(cyclopentadienyl)magnesium ($CP_2MG$;$Mg(C_5H_5)_2$) as a p-type doping gas; and $H_2$ and $N_2$ as carrier gases. Needless to say, the materials employed in crystal growth of Group III nitride semiconductor through conventional MOCVD may be employed as the raw material gases other than the above. For example, triethylindium (TEI;$In(C_2H_5)_3$) may be used as an In source other than TMI.

Firstly, a sapphire substrate 10 is prepared, and the sapphire substrate 10 is heated in a hydrogen atmosphere for surface cleaning.

Figure 3A:
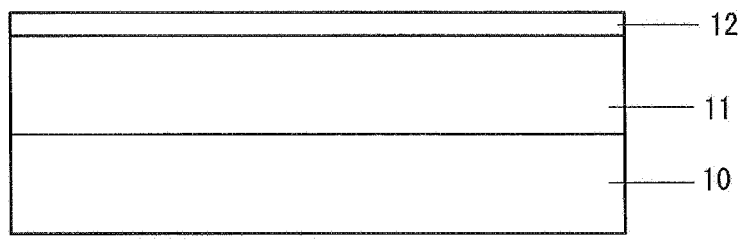
FIGS. 3A to 3D are sketches showing processes for producing the light-emitting device according to Embodiment 1.

Next, an AlN buffer layer (not illustrated) is formed at a temperature of 400° C. through MOCVD on the sapphire substrate 10. Other than AlN, GaN and AlGaN may be used. Subsequently, an n-type contact layer 11 is formed at a growth temperature of 1,100° C. through MOCVD on the buffer layer. Then, on the n-type contact layer 11, an n-type cladding layer 12 is formed at a growth temperature of 830° C. through MOCVD (FIG. 3A).

Figure 3B:
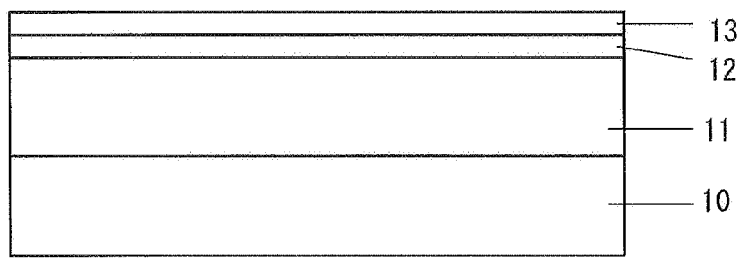

Subsequently, on the n-type cladding layer 12, a light-emitting layer 13 having a MQW structure is formed through MOCVD. The light-emitting layer 13 is formed by repeatedly depositing three to ten layer units, each layer unit comprising a well layer 13A, a first protective layer 13B, a second protective layer 13C, and a barrier layer 13D deposited in this order (FIG. 3B).

Here, processes for forming the light-emitting layer 13 will be described in more detail with reference to FIGS. 4A to 4E and FIG. 5.

Firstly, on the n-type cladding layer 12, an AlGaN barrier layer 13D is formed at a temperature of 765° C. to 985° C. through MOCVD (FIG. 4A).

Subsequently, the temperature is decreased to a temperature lower than the growth temperature of the barrier layer 13D within a range of 700° C. to 850° C., and then an InGaN well layer 13A is formed through MOCVD (FIG. 4B). It is important to increase the growth temperature in order to improve the crystal qualities of the well layer 13A and the barrier layer 13D while keeping a desired wavelength. Therefore, the growth temperature of the well layer 13A is preferably, 750° C. to 850° C., and further preferably, 800° C. to 850° C.

Next, on the well layer 13A, a first protective layer 13B is formed of InGaN at the same temperature as employed for the well layer 13A through MOCVD (FIG. 4C). However, a tolerance of approximately ±10° C. is allowable for the growth temperatures of the well layer 13A and the first protective layer 13B.

Here, in forming the first protective layer 13B, ammonia as a nitrogen source, TMG as a Ga source, and carrier gases are continuously supplied, and TMI as an In source is pulse supplied by repeating supply and non-supply (FIG. 5). This is performed by opening and closing the valve of the TMI supply pipe in a predetermined cycle. The number of pulses may be any value as long as it is not less than two. The supply amount of TMI is kept constant at a predetermined amount within a range of more than 0 μmol/min and not more than 2 μmol/min. Moreover, the duty ratio D is kept constant at a predetermined value of more than 0 and not more than 0.95. The duty ratio D is the ratio of pulse width t to pulse cycle period T, (t is TMI supply time per one period T), and D=t/T.

Since the In composition ratio of the first protective layer 13B is almost directly proportional to the duty ratio D, the In composition ratio can be easily and accurately controlled by controlling the duty ratio D. The proportional coefficient in this case is almost determined by the TMI supply amount, the TMG supply amount, and the growth temperature.

Then, the first protective layer 13B is formed so as to have an In composition ratio within a range of more than 0 at % and not more than 3 at % by controlling the duty ratio D. Such an In composition ratio of the first protective layer 13B can improve the crystal quality of the first protective layer 13B, thereby reducing carrier loss in the first protective layer 13B. As a result, the emission efficiency of the light-emitting device can be improved. Moreover, by controlling the In composition ratio to not more than 3 at %, new defects caused by the incorporation of In into the crystal are prevented and a decrease in device reliability is suppressed.

The thickness of the first protective layer 13B can be controlled by the number of pulses so that the first protective layer 13B is formed so as to have a thickness of 0.2 nm to 1.8 nm.

As mentioned above, the first protective layer 13B of InGaN can be formed so as to have an In composition ratio of more than 0 at % and not more than 3 at % by pulse supplying TMI and controlling the duty ratio D, thereby improving the emission efficiency. To further improve the emission efficiency, In composition ratio of the first protective layer 13B is preferably, 1 at % to 3 at %, and further preferably, 1 at % to 2.5 at %.

When the first protective layer 13B is actually formed, the In concentration of the first protective layer 13B is difficult to be controlled to not more than $1\times10^{16}/cm^3$. Therefore, "In composition ratio of more than 0 at %" substantially means the In composition ratio that attains an In concentration of $1\times10^{16}/cm^3$ or more.

Moreover, any supply amount (pulse height) of TMI may be used as long as it is more than 0 μmol/min and not more than 2 μmol/min. However, it is preferably a value as small as possible, that is, the minimum value that is structurally possible in the MOCVD system. The supply amount of TMI is preferably controlled so that the growth speed of the first protective layer 13B is slower than that of the well layer 13A. This is to improve the crystallinity of the first protective layer 13B.

The pulse width t and the cycle period T may be any value as long as the duty ratio D is within the above range.

Moreover, various conditions (such as pulse height or duty ratio D) for pulse supply of TMI may be kept constant or changed during growth of the first protective layer 13B.

Subsequently, on the first protective layer 13B, a second protective layer 13C is formed of AlGaN at the same temperature as employed for the first protective layer 13B through MOCVD (FIG. 4D).

Next, the supply of raw material gases is stopped, and the temperature is increased to a temperature higher than the growth temperature of the second protective layer 13C within a range of 765° C. to 985° C. Although the second protective layer 13C is gradually thinned due to thermal decomposition during heating, the second protective layer 13C can be remained until the growth start of the barrier layer 13D because the thickness of the second protective layer 13C is set within the above range. Moreover, the presence of the second protective layer 13C prevents In evaporation from the well layer 13A, and suppresses damage to the well layer 13A, thereby improving the emission efficiency.

Then, the supply of raw material gases is restarted, and on the second protective layer 13C, a barrier layer 13D is formed of AlGaN at a temperature higher than the growth temperature of the second protective layer 13C within a range of 765° C. to 985° C. through MOCVD (FIG. 4E). The barrier layer 13D can be grown with good crystallinity by growing at a temperature higher than those of the first protective layer 13B and the second protective layer 13C, thereby improving the emission efficiency. Difference of the growth temperature of the well layer 13A, the first protective layer 13B, and the second protective layer 13C from the growth temperature of the barrier layer 13D is preferably 50° C. to 200° C. When the temperature difference is less than 50° C., the crystallinity of the barrier layer 13D is not sufficiently improved, and when the temperature difference exceeds 200° C., the crystallinity of the well layer 13A is deteriorated.

Thereafter, on the barrier layer 13D, a well layer 13A, a first protective layer 13B, a second protective layer 13C, and a barrier layer 13D are sequentially and repeatedly deposited several times in the same way as mentioned above, as a result a light-emitting layer 13 having a MQW structure shown in FIG. 2 is formed.

Figure 3C:
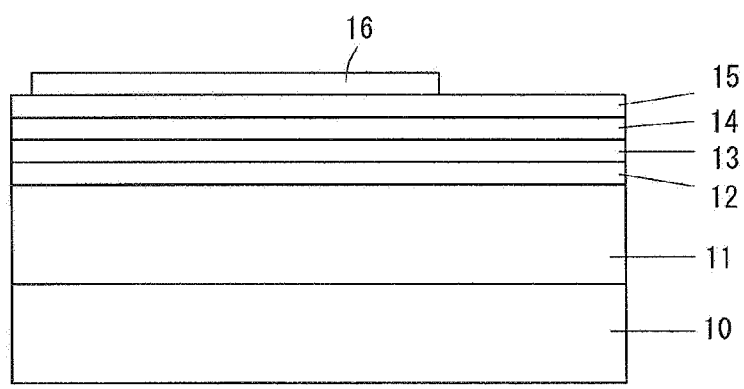

Next, a p-type cladding layer 14 and a p-type contact layer 15 are sequentially formed through MOCVD on the light-emitting layer 13, and a transparent electrode 16 is formed by sputtering or vapor deposition on a part of the p-type contact layer 15 (a part on which a trench 19 is not formed in the next process) (FIG. 3C).

Figure 3D:
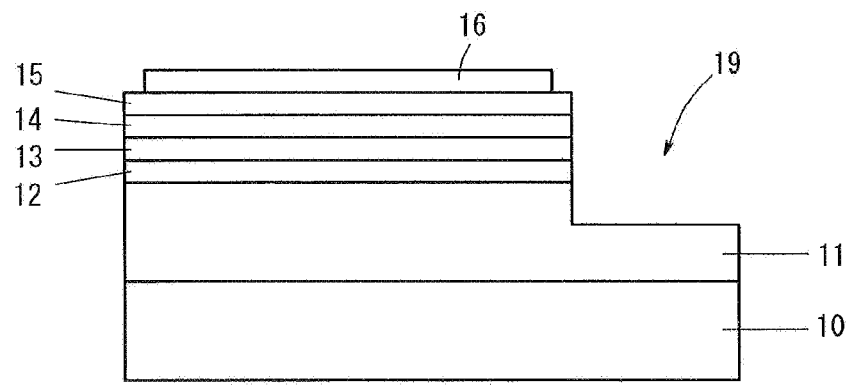

Subsequently, a trench having a depth reaching the n-type contact layer 11 is formed by dry etching the surface of the p-type contact layer 15 on which the transparent electrode 16 is not formed (FIG. 3D). After the formation of the trench 19, the transparent electrode 16 may be formed.

Next, a p-electrode 17 is formed by vapor deposition on a predetermined part of the transparent electrode 16, and an n-electrode 18 is formed on a predetermined part of the n-type contact layer 11 exposed in the bottom of the trench 19. Either of the p-electrode 17 and the n-electrode 18 may be formed first. When they are formed of the same material, they may be formed simultaneously. After that, Mg is activated by annealing in an nitrogen atmosphere, and the p-type cladding layer 14 and the p-type contact layer 15 attain p-type conduction. Annealing for attaining p-type conduction may be performed before forming the p-electrode 17 and the n-electrode 18. Moreover, when the transparent electrode 16 is formed of, for example, ITO, and annealing for its crystallization is performed, the annealing for the transparent electrode 16 may be the same as the annealing for attaining p-type conduction. Thus, the light-emitting device according to Embodiment 1 shown in FIG. 1 is produced.

By the method for producing the light-emitting device according to Embodiment 1, even when a first protective layer 13B is formed of InGaN at the same low temperature as employed for the well layer 13A, the In composition ratio can be more than 0 at % and not more than 3 at % because the raw material gas as an In source is pulse supplied. Therefore, the crystal quality of the first protective layer 13B can be improved, reducing carrier loss in the first protective layer 13B. As a result, the emission efficiency of the light-emitting device can be improved.

[Experiment Result]

Next will be described the result of various experiments performed for the light-emitting device according to Embodiment 1.

In pulse supplying TMI when forming the first protective layer 13B, the In composition ratio was measured at different duty ratios D. Four duty ratios D were used: 0, 0.25, 0.5, and 1. The TMI supply amount was constant as 2 μmol/min, the pulse cycle period T was 12 seconds, and the number of pulses was 2. Further, the growth temperature of the first protective layer 13B was 820° C. Duty ratio D=0 means the case when TMI is not supplied, and duty ratio D=1 means the case when TMI is continuously supplied.

Figure 6:
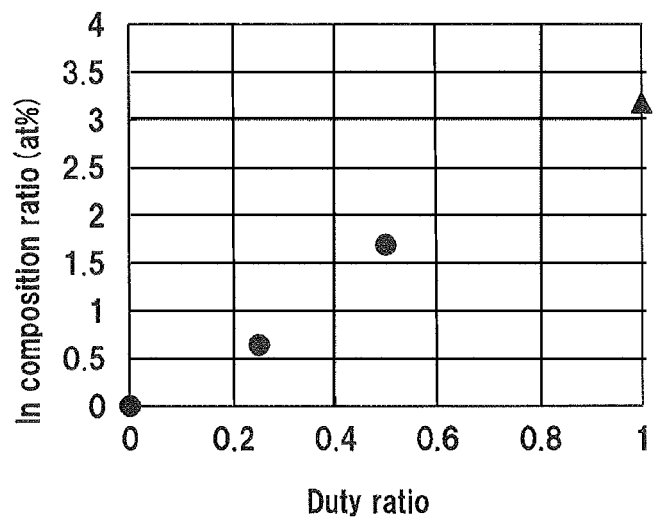
FIG. 6 is a graph showing the relationship between duty ratio and In composition ratio of a first protective layer 13B.

FIG. 6 is a graph showing the relationship between pulse duty ratio D and In composition ratio of the first protective layer 13B. As shown in FIG. 6, as the duty ratio D is increased from 0, the In composition ratio is also increased. When the duty ratio D reached 1, the In composition ratio was about 3.2 at %. The In composition ratio was almost directly proportional to the duty ratio D. Therefore, it was found that the In composition ratio of the first protective layer 13B can be easily and accurately controlled by controlling the duty ratio D. It was also found from FIG. 6 that when the duty ratio D is controlled to not more than 0.95, the In composition ratio can be controlled to not more than 3 at %. More specifically, the In composition ratio can be controlled from 1 at % to 3 at % by controlling the duty ratio D from 0.35 to 0.95, and the In composition ratio can be controlled from 1 at % to 2.5 at %, by controlling the duty ratio D from 0.35 to 0.75.

Figure 7:
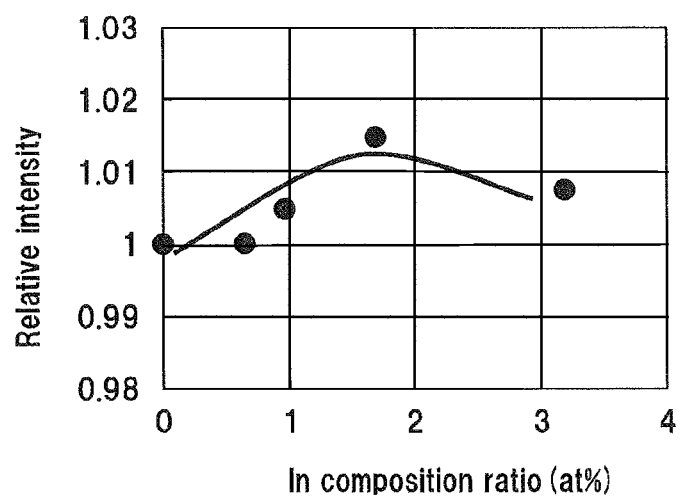
FIG. 7 is a graph showing the relationship between In composition ratio of the first protective layer 13B and relative intensity.

FIG. 7 is a graph showing the relationship between In composition ratio of the first protective layer 13B and relative intensity. The relative intensity is normalized by the light output when the In composition ratio of the first protective layer 13B is 0 at %, that is, the first protective layer 13B is formed of AlGaN, as 1.

As shown in FIG. 7, the light intensity is increased as the In composition is increased. However, the light intensity is peaked at about the In composition ratio of 1.7 at % and then started to decrease. The reason why the light intensity is increased until the In composition ratio reaches 1.7 at % is considered that the crystal quality of the first protective layer 13B is improved, thereby reducing carrier loss in the first protective layer 13B. The reason why the light intensity is decreased when the In composition ratio exceeds 1.7 at % is considered that new crystal defects occur due to In. As is clear from FIG. 7, even when the In composition ratio exceeds 3 at %, the light intensity is larger than that at the In composition ratio of 0 at %. However, new defects are increased due to increase of In, resulting in reduction in device reliability. Therefore, the In composition ratio is preferably not more than 3 at %.

Variation

In Embodiment 1, the first protective layer 13B of the light-emitting layer 13 is formed of InGaN having an In composition ratio of more than 0 at % and not more than 3 at % by pulse supplying the raw material gas as an In source. The present invention is not limited to this. The present invention can be applied as long as Group III nitride semiconductor (such as InGaN, AlGaInN, and AlInN) containing In is formed at a low temperature. For example, the present invention may be applied to a layer other than the light-emitting layer of the light-emitting device, and also to a semiconductor device other than the light-emitting device.

Easiness of incorporation of In into the crystal depends very sensitively on the growth temperature. When the growth temperature is high, In is difficult to be incorporated. When the growth temperature is low, In is easy to be incorporated.

Moreover, the TMI supply amount usually can only be reduced up to a certain value due to the structural factor of the MOCVD system. Therefore, the In composition ratio of Group III nitride semiconductor containing In could only be reduced up to a certain minimum value in a case of continuously supplying TMI.

In is easy to be incorporated into the crystal at a low growth temperature. The lower the growth temperature, the higher the minimum value of the In composition ratio. For example, as shown in FIGS. 6 and 7, when the growth temperature was 820° C., the In composition ratio could only be reduced up to 3.2 at %. However, the present invention enables reduction of the In composition ratio to a value exceeding the limit value. More specifically, the In composition ratio can be reduced to more than 0 at % and not more than 3 at %.

The present invention is effective to the case when the growth temperature of Group III nitride semiconductor containing In (more specifically, InGaN and AlGaInN) is 700° C. to 850° C. When crystal is grown by continuously supplying In at such a low temperature, the In composition ratio conventionally could not be reduced to more than 0 at % and not more than 3 at %. However, Group III nitride semiconductor having such an In composition ratio can be formed by applying the present invention.

The light-emitting device produced according to the present invention can be employed as a light source of a display apparatus or an illumination apparatus.

What is claimed is:

1. A method for producing a Group III nitride semiconductor light-emitting device having a light-emitting layer with a multiple quantum well (MQW) structure, the method comprising:

forming the light-emitting layer through metal organic chemical vapor deposition (MOCVD) by sequentially and repeatedly depositing a well layer comprising Group III nitride semiconductor containing In, a first protective layer comprising Group III nitride semiconductor containing In, a band gap of the first protective layer being equal to or larger than a band gap of the well layer, and a barrier layer comprising Group III nitride semiconductor, a band gap of the barrier layer being larger than a band gap of the well layer; wherein the first protective layer is formed at the same temperature as employed for the well layer by pulse supplying a raw material gas as an In source so as to achieve an In composition ratio of more than 0 at % and not more than 3 at %.

2. The method for producing the light-emitting device according to claim 1, wherein the In composition ratio of the first protective layer is controlled by a duty ratio when pulse supplying the raw material gas as an In source.

3. The method for producing the light-emitting device according to claim 2, wherein the duty ratio when pulse supplying the raw material gas as an In source is more than 0 and not more than 0.95.

4. The method for producing the light-emitting device according to claim 1, wherein a supply amount of the raw material gas as an In source is more than 0 μmol/min and not more than 2 μmol/min.

5. The method for producing the light-emitting device according to claim 1, wherein a growth temperature of the well layer and the first protective layer is 700° C. to 850° C.

6. The method for producing the light-emitting device according to claim 1, wherein the first protective layer comprises InGaN.

7. The method for producing the light-emitting device according to claim 1, wherein a second protective layer comprising Group III nitride semiconductor containing Al is formed between the first protective layer and the barrier layer, and the second protective layer has an Al composition ratio so as to have a band gap larger than a band gap of the first protective layer.

8. The method for producing the light-emitting device according to claim 7, wherein the second protective layer comprises AlGaN.

9. The method for producing the light-emitting device according to claim 1, wherein the raw material gas as an In source is trimethylindium.

10. A method for producing a Group III nitride semiconductor device, the method comprising:
controlling a growth temperature in a range of 700° C. to 850° C.; and
forming a semiconductor layer comprising Group III nitride semiconductor containing In with an In composition ratio of more than 0 at % and not more than 3 at % by pulse supplying a raw material gas as an In source with controlling a duty ratio in a range more than 0 and not more than 0.95 through metal organic chemical vapor deposition (MOCVD).

11. The method for producing the light-emitting device according to claim 1, wherein the pulse supplying of the raw material gas comprises alternately supplying and non-supplying the raw material gas.

12. The method for producing the light-emitting device according to claim 1, wherein an In composition ratio of the first protective layer is in a range from 0.5 at % to 3 at %.

13. The method for producing the light-emitting device according to claim 1, wherein an In composition ratio of the first protective layer is in a range from 1 at % to 2.5 at %.

* * * * *